United States Patent [19]

Lee et al.

[11] Patent Number: 4,954,862
[45] Date of Patent: Sep. 4, 1990

[54] EXPOSURE APPARATUS FOR COLOR IMAGING SYSTEM

[75] Inventors: Sungmuk Lee, Miamisburg, Ohio; Shigemi Misono, Tokyo, Japan

[73] Assignees: The Mead Corporation; Seiko Instruments Inc., Japan

[21] Appl. No.: 203,007

[22] Filed: Jun. 6, 1988

[30] Foreign Application Priority Data

Jun. 5, 1987 [JP] Japan .............................. 62-141277

[51] Int. Cl.$^5$ ...................... G03B 27/00; G03B 27/72
[52] U.S. Cl. ........................................ 355/1; 355/67; 355/71; 355/27
[58] Field of Search ............... 355/1, 27, 28, 30, 70, 355/67, 71

[56] References Cited

U.S. PATENT DOCUMENTS

| | | | |
|---|---|---|---|
| 4,095,881 | 6/1978 | Maddox | 355/30 |
| 4,399,209 | 8/1983 | Sanders et al. | 430/138 |
| 4,474,453 | 10/1984 | Yanagawa et al. | 355/70 |
| 4,611,901 | 9/1986 | Kohyama et al. | 355/4 |
| 4,714,943 | 12/1987 | Sakakibara et al. | 355/27 |
| 4,737,822 | 4/1988 | Taniguchi et al. | 355/27 |

*Primary Examiner*—Michael L. Gellner
*Assistant Examiner*—D. Rutledge
*Attorney, Agent, or Firm*—Bruce L. Adams; Van C. Wilks

[57] ABSTRACT

An exposure apparatus has cold mirrors for reflecting visible rays irradiated from light sources and for allowing infrared rays and a part of visible rays irradiated from said light sources to pass therethrough, disposed on a side of a case body. The exposure apparatus eliminates an excessive heat-up at an original image support station by using the cold mirrors and increases a tonality and an effective speed for forming a latent image on a photosensitive sheet with supplementary exposures using a leak of light passed through the cold mirrors.

15 Claims, 3 Drawing Sheets

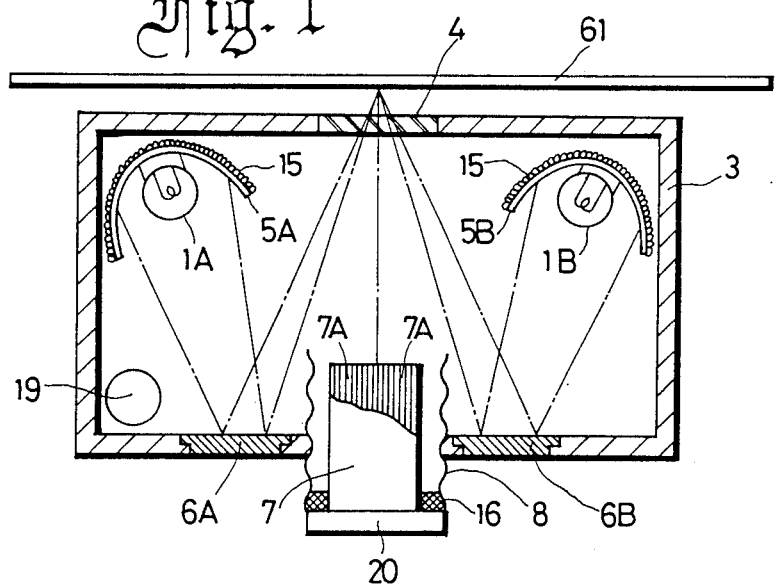
Fig. 1
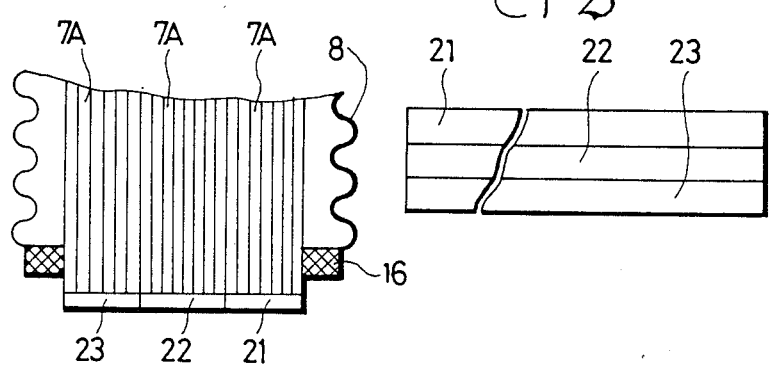
Fig. 2
Fig. 3

EXPOSURE APPARATUS FOR COLOR IMAGING SYSTEM

FIELD OF THE INVENTION

This invention relates to an exposure apparatus which is suitable for a color imaging system which directly exposes original images to an imaging sheet.

BACKGROUND OF THE INVENTION

Many different systems are proposed for making photocopies. Roughly, there are two different systems, one is the xerography system in which color toner is used, and the other, the imaging system in which a photosensitive sheet having a carrier such as paper, etc. with coloring dyes coated over the carrier is used. According to the xerography system, an image or a pattern is formed on a charged photosensitive member by utilizing a suitable optical system, powder of colored resin called toner is adhered to a not-irradiated portion on the photosensitive member where the charge is still retained, the adhered powder is transferred onto a copying paper, and then the transferred powder forming an image is fixed to obtain a copy. The xerography system described above requires a photoconductor, a toner applying apparatus and a heat fixing device of the toner. Moreover, as the toner is consumed, it is necessary to always store and supplement the toner. For this reason, the construction of the apparatus becomes complicated and the maintenance thereof is troublesome.

In order to solve the above problems, imaging systems based on photosensitive sheets are known. F.W. Sanders et al, U.S. Pat. Nos. 4,399,209 and 4,440,846 describe an imaging system wherein a photosensitive layer comprising microcapsules containing a photosensitive composition in the internal phase is image-wise exposed to actinic radiation and subjected to a uniform rupturing force whereupon the microcapsules rupture and image-wise release the internal phase. Image-forming agents such as substantially colorless chromogenic materials are typically associated with the microcapsules, so that when the microcapsules rupture the chromogenic materials are able to image-wise react with a developer material and produce a color image. This imaging system provides an apparatus of simpler structure.

However, since such a photosensitive sheet has a low sensitivity and requires a powerful light source for forming a latent image thereon, the light irradiating an original image has caused an excessive heat build-up at the original image support station.

Furthermore, since such photosensitive sheet has a characteristic in which the change of the optical density with respect to the increase of incident light energy steeply occurs, it is difficult to obtain a precise tone gradation.

SUMMARY OF THE INVENTION

Thus, a principal object of the present invention is to provide an imageing system in which an exposure apparatus is so constructed as to eliminate an excessive heat build-up at an original image support station regardless of whether an original is irradiated with a powerful light for forming a latent image on a photosensitive sheet.

Another object of the present invention is to provide an imaging system in which tone control becomes easy with supplementary exposures using a leak of light from the exposure apparatus.

Still another object of the present invention is to provide an imaging system which increase the effective speed for forming a latent image on a photosensitive sheet with supplementary exposures using a leak of light from the exposure apparatus.

The above and other related objects and features of the invention will be apparent from a reading of the following description of the disclosure found in the accompanying drawings and the novelty thereof pointed out in the appended claims.

BRIEF DESCRIPTION OF THE DRAWINGS

The present invention will be explained in more detail by reference to the accompanying drawings wherein:

FIG. 1 is a sectional view of an embodiment of exposure apparatus in accordance with the present invention, FIG. 2 is an expanded sectional view of a light condensing member in the apparatus shown in FIG. 1, FIG. 3 is an expanded sectional view of the filter portion shown in FIG. 2.

DETAILED DESCRIPTION OF THE INVENTION

Figure 4:
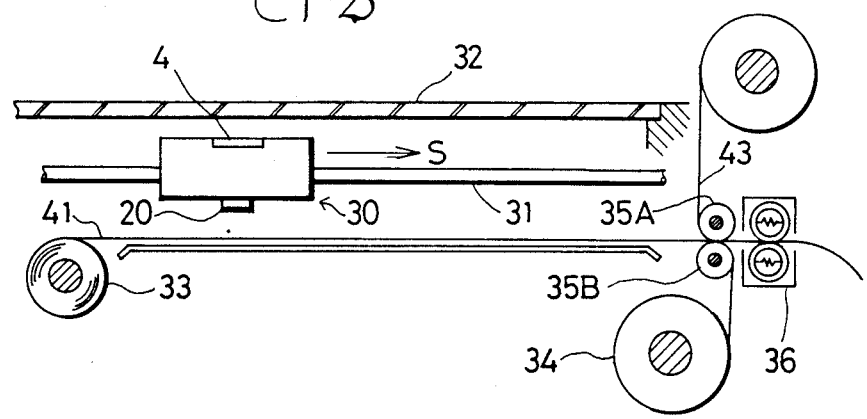
FIG. 4 is a diagrammatic illustrations of imaging apparatus suitable for performing the function of the present invention.

This invention will now be explained with reference to the accompanying drawings as below.

FIG. 1 shows a sectional view of an embodiment of exposure apparatus in accordance with the present invention. High power cylindrical lamps, e.g. halogen lamps 1A and 1B are disposed on both sides of a transparent window 4 in a case body 3 and each is provided with a parabolic reflector, 5A and 5B respectively at the back thereof. The light from the lamps is reflected onto cold mirrors 6A and 6B and focused outside of the transparent window 4. The cold mirrors 6A and 6B are disposed in positions where the light flux from the parabolic reflectors 5A and 5B is reflected toward the transparent window 4 and having various coating layers whereby infrared rays and part of the visible rays are transmitted outside the case body 3, while parts most parts of the visible ray are reflected forward the window 4. A light condensing member 7 consisting of lens-like light transmitting material, e.g. SELFOC LENS (registered trademark) 7A, evenly disposed in the direction of the axes of the lamps in at least 3 rows. The light condensing member 7 is placed with one end face thereof opposing to the transparent window 4, and the other end face extruding from the case body 3, in a position where images are focused on an imaging sheet 41. The light transmitter material 7A is evenly disposed in the direction of the axis of the lamps 1A and 1B in at least three rows. A cylinder 8 is provided around and spaced apart from the periphery of the light condensing member 7 through which the air inside the case body communicates with the air outside the case body, and a blower 19 is provided to draw in the outside air for cooling the light condensing member 7. A heat insulating material 15 is provided at the backs of parabolic reflectors 5A and 5B. A filtering material 16 is provided at the air intake port. A filter element 20 consisting of a plurality of optical filters 21-23 is provided at one end of the light condensing material 7.

Figure 5:
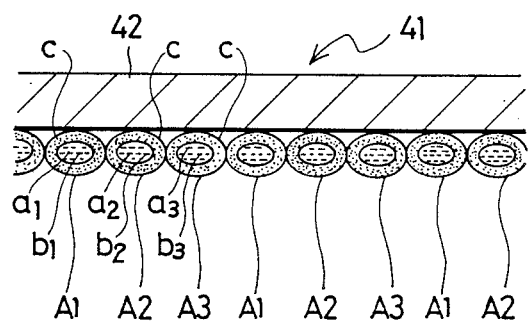
FIG. 5 is a sectional view of the imaging sheet used in the present invention.

FIG. 2 shows an expanded sectional view of the light condensing member 7. As shown in FIG. 2, one end face of the light condensing material 7, the light projecting side in this embodiment, is provided with 3 different filters 21, 22 and 23 laid in parallel with the scanning direction wherein the light reflected on the original image surface is resolved into wave-lengths $\lambda 1$, $\lambda 2$, and $\lambda 3$ which react to microcapsules A1, A2 and A3 respectively (FIG. 5). The expanded sectional view of the three different-filters is shown in FIG. 3. In the embodiment shown in FIG. 3, the first filter 21 is selected to be of a material which transmits only the ray of light to which yellow within the capsules reacts, and likewise, the second filter 22 and third filter 23 should selectively transmit the rays of light to which cyan and magenta react respectively.

FIG. 4 shows a digrammatic illustration of imaging apparatus wherein the abovementioned exposure apparatus is incorporated. The exposure apparatus 30 is reciprocately disposed on a guide member 31 along the main scanning direction with respect to an original image mount 32. On the side of the transparent window 4 is provided the original image mount 32 of a glass plate, and on the light projecting said of the light condensing member 7 is provided the imaging sheet 41 which is stretched between a feed roller 33 and a winding roller 34. In the area downstream from the edge of the area where latent images are formed, pressure rollers 35A and 35B are disposed to press-bind the image receiving sheet 43 to the photo-sensitive surface of the imaging sheet 41. A heat roller 36 is provided in the area downstream from the pressure rollers.

Figure 6:
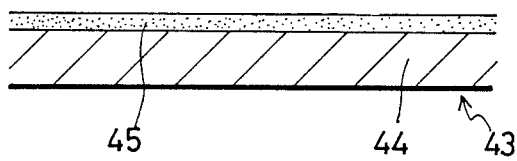
FIG. 6 is a sectional view of the image-receiving sheet used in the present invention.
Figure 9:
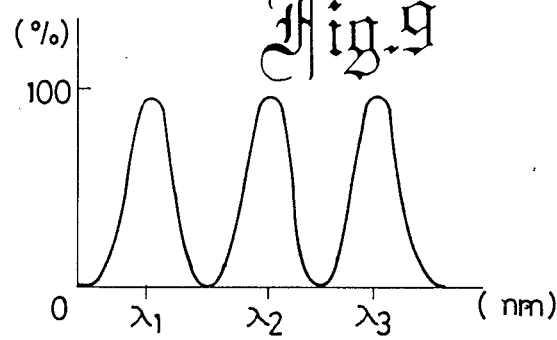
FIG. 9 is a schematic diagram showing the photosensitive characteristic of the imaging sheet shown in FIG. 5.

FIG. 5 and FIG. 6 respectively show a sectional view of the image sheet, and of the image-receiving sheet used in the present invention. Such an imaging sheet and image-receiving sheet are disclosed in U.S. Pat. Nos. 4,399,209 and 4,440,846. In FIG. 5, the imaging sheet 41 has a layer of pressure rupturable microcapsules coated on a substrate 42. The microcapsules A1, A2, A3 present colors of cyan, magenta and yellow respectively. Chromogenic materials a1, a2 and a3 which generate cyan, magenta and yellow respectively and reactive composites b1, b2 and b3 which change their own viscosity and immobilize the chromogenic materials in response to irradiation with electromagnetic beams of wave-length $\lambda 1$, $\lambda 2$ and $\lambda 3$ (see FIG. 9), such as light beams which vary from one chromogenic material to another, are encapsulated in the form of microcapsules by surrounding with thin films C of gelatin or the like. In FIG. 6, the image-receiving sheet 43 is composed of a sheet 44 which is located by a developing material 45. When the abovementioned imaging sheet 41 is exposed to light having wavelengths to which the reactive composites b1, b2 and b3 within the microcapsules A1, A2 and A3 reach, the viscosity of the reactive composites b1, b2 and b3 changes. The imaging sheet exposed to the light as described above and the image-receiving sheet 43 overlap one upon another. These two sheets are pressed with pressure rollers 35A and 35B so that the capsules A1, A2 and A3 are ruptured. As a result, there comes out a difference in the amount of the chromogenic materials released from the capsules from exposed to the light and those unexposed is different. Consequently, colors corresponding to the wavelengths $\lambda 1$, $\lambda 2$ and $\lambda 3$ of the exposed light are presented on the image-receiving sheet 43 wherein color patterns corresponding to the original image are obtained.

Figure 7:
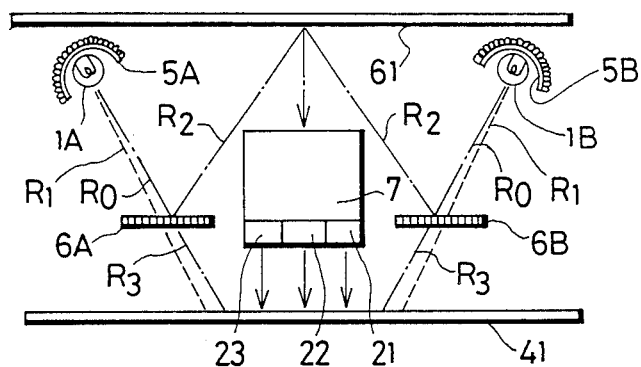
FIG. 7 is a diagrammatic illustration showing the basic components of the exposure apparatus shown in FIG. 1.

FIG. 7 shows a diagrammatic illustration showing the works of each component of the exposure apparatus. In the operation of the apparatus with all the components so arranged as described above, the rays of light R0 emitted from the lamps 1A and 1B are focused with the parabolic mirrors 5A and 5B and then irradiated on the cold mirrors 6A and 6B. Infrared rays R1 and some of the visible rays R3 pass through the cold mirrors. The majority of the visible rays R2 are reflected to irradiate the original image 61. The visible rays R3 passed through the cold mirror 6 irradiate the unexposed portion of the imaging sheet 41 and provide each microcapsule A1, A2 and A3 with evenly distributed light-bias. Since few infrared rays irradiate the original image 61, the exposure apparatus 30 eliminates the excessive heat-up at the original image support station. Furthermore, supplementary exposures using the leak of visible rays R3 make the tone control easy as described below.

Figure 8:
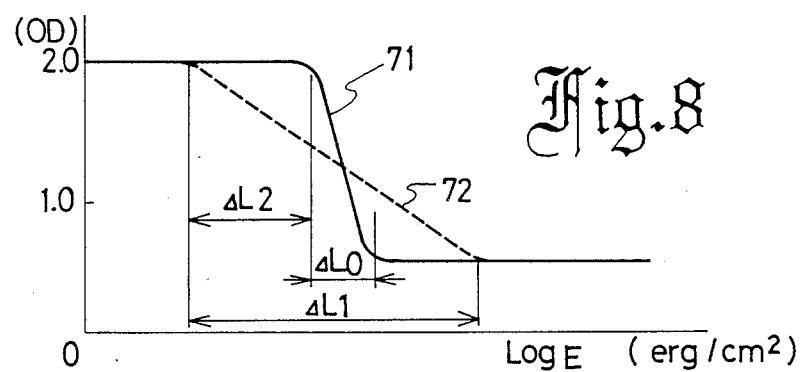
FIG. 8 is a diagram showing the relation between the energy of incident light and optical density of the imaging sheet.

FIG. 8 shows a diagram of the relation between the energy of incident light and optical density of the imaging sheet 41. When the light-bias is provided to an extent that each microcapsule does not react, the portion 71 representing the tone has a lesser slope, in other words, the slope of the optical density to light energy curve becomes such that the tonal range is widened from $\Delta L0$ to $\Delta L1$. Simultaneously, due to the effect of the accumulated light energy with supplementary exposures, the effective speed of the imaging sheet allows shorter exposure time.

On the other hand, the rays of light R2 irradiating the original image are reflected according to the spectrums corresponding to the colors of the pattern forming the original image and its optical density, and impence upon the light condensing member 7. The reflected light incident on the light condensing member 7 is then transmitted through the light transmitting materials 7A arranged therein, evenly converged without regard to the angles of incidence and is incident upon the first, second and third filters 21, 22 and 23 provided at the projection side of the light condensing member 7. The reflected light is thereby resolved into light having wave-lengths $\lambda 1$, $\lambda 2$ and $\lambda 3$.

With the abovementioned condition being kept, the exposure apparatus 30 is shifted in the main scanning direction as indicated with an arrow S shown in FIG. 4. First, a part of the imaging sheet 41 is exposed with the light of wavelength $\lambda 1$ passing through the first filter 21, whereby only microcapsules A1 sensitive to the wavelength $\lambda 1$ solidify to a degree corresponding to the amount of the light exposed.

As the exposure apparatus 30 shifts, the portion irradiated with the light passing through the first filter 21 is then exposed to the light of wavelength $\lambda 2$ passing through the second filter 22, and only microcapsules A2 sensitive to the wavelength $\lambda 2$ solidify to a degree corresponding to the amount of the light exposed. In the same manner, exposure with the light passing through the third filter 23 is carried out.

Namely, the microcapsules A2 and A3 remain unexposed even after they have been subjected to the irradiation of the light of wavelength λ1. When the scanning apparatus is further shifted, and the portion which has already been exposed to wavelengths λ1 and λ2 reaches the area of the third filter 23, then the microcapsules A3 are exposed. By this, one portion is subjected to the exposure corresponding to the three primary colors, and forms a latent but same color image as the original image.

While, during this exposure process, the visible light R3 passed through the other cold mirror evenly irradiates the microcapsules A1, A2 and A3 in only the already exposed area, and increases the tonality and photosensitivity thereof.

By shifting the exposure apparatus 30 in the manner as mentioned above, the original image is successively chromatically resolved by the filters 21-23 and multi-exposed on the imaging sheet 41, forming the latent image. When a latent image has been formed on the imaging sheet 41, the imaging sheet 41 and the image receiving sheet 43 overlap one upon another between the roller 35A and 35B and are press-bonded together. As the reactive composites b1, b2 and b3 encapsulated in microcapsules A1, A2 and A3 on the imaging sheet 41 have solidified to varying degrees according to the amount of exposure to the light, the amount of the chromogenic materials a1, a2 and a3 released from the capsules A1, A2 and A3 varies depending upon the degree of exposure to the light. The chromogenic materials a1, a2 and a3 of which each amount corresponds to the amount of exposure to the light exude onto the image-receiving sheet 43 from the portion of the imaging sheet 41 where passed by the pressure rollers 35A and 35B. The imaging sheet 41, after passing through the rollers 35A and 35B, is rolled around the winding roller 34, while the image-receiving sheet 43 is heated by the heat roller 36 so as to accelerate the reaction between developing material 45 and the chromogenic materials a1, a2 and a3 exuded from the imaging sheet 41, and colors corresponding to the original image are presented thereon and color patterns corresponding to the original image are obtained. Obviously, since many microcapsules A1, A2 and A3 presenting the three primary colors are coated on the surface of the imaging sheet 41, color pictures reproduced are presented as aggrevated tiny dots of the three primary colors wherein every primary color is melted with one another.

When the tone of the printed image is desired to be changed, the second and third filters 22 and 23 are to be shifted so as to change the effective width of each filter. By this operation, the ratio of the light passing through the first, the second and the third filters 21, 22 and 23 changes, therefore the number of capsules controlling each color change. In this manner, the tonality is adjusted.

In the above embodiment, the light source 1A and 1B are provided on the each side of the transparent window 4. However, it is obvious that the same effect shall be obtained with light sources provided on one side of the transparent window.

Although the filter member 16 is provided at the projecting side of the light condensing member 7 in the above embodiment, it is obvious that the same effect can be obtained when the filter members are provided at the light incident side or both sides thereof.

In the foregoing embodiment, the visible light passed through the cold mirrors 6A and 6B is directly irradiated on the imaging sheet 41. Further to the above, attenuating cold mirrors may be installed to control the amount of light irradiating the imaging sheet 41, in case such irradiation amount is in excess.

Also, in the foregoing embodiment, the light irradiated on the original image is resolved into three wavelength components and then irradiated to the imaging a sheet 41. Resolution of the light is relatively a dependent on the correlation between the spectral characteristic of the light source and the characteristic of the photosensitivity of the imaging sheet. Therefore, it is obvious that the same effect can be obtained with an apparatus wherein the three rays of the reflected light from the original image, two filtered rays and an unfiltered ray, are irradiated on the imaging sheet, or wherein the reflected light from the original image is directly irradiated onto the imaging sheet without having been resolved in case the imaging sheet to be used has the same photosensitive characteristic as the luminosity factor.

What is claimed is:

1. An exposure apparatus for exposing a photosensitive sheet comprising:
    a light source for providing irradiating light to an original image;
    a cold mirror for reflecting visible light from said light source toward said original image and for allowing infrared rays and a portion of the visible light nonrepresentative of the original image to pass therethrough, said portion of visible light passing through said cold mirror being incident on the photosensitive sheet; and
    optical members for focusing light representative of the original image reflected from said original image onto said photosensitive sheet.

2. The exposure apparatus according to claim 1, wherein said photosensitive sheet comprises a photosensitive and pressure-sensitive recording sheet having a substrate and a layer of microcapsules coated thereon.

3. The exposure apparatus according to claim 1, wherein said optical members have, on at least one end face thereof, a plurality of optical filters having different spectral characteristics to each other.

4. The exposure apparatus according to claim 3, wherein said plurality of optical filters controls the amount of light passing through each of said filters by changing areas of said filters.

5. An optical system for exposing a photosensitive substrate, with an image of an object comprising:
    a source of light in the visible and infrared spectrums; and
    filter means for separating the visible light spectrum from the infrared spectrum and having means for transmitting a selected portion of said visible light spectrum through said filter means to impinge upon the photosensitive substrate, the remaining portion of said visible light spectrum incident upon said filter means being reflected toward the object; and
    optical means for focusing visible light reflected from the object onto the photosensitive substrate.

6. The optical system in claim 5; in which said filter means comprises a cold mirror.

7. The optical system of claim 6; in which said source of light is disposed between said object and said photosensitive substrate.

8. The optical system of claim 7; in which said cold mirror is disposed between said source of light and said photosensitive substrate.

9. The optical system of claim 8; in which said object is located at a document plane and the visible light reflected from said cold mirror is focused on said document plane.

10. The optical system of claim 9; comprising more than one source of light in the visible and infrared spectrums.

11. The optical system of claim 10; comprising a cold mirror associated with each of said sources of light.

12. The optical system of claim 11; wherein said optical means comprises means for focusing light representative of the object reflected from said document plane onto said photosensitive substrate.

13. The optical system of claim 12; in which one of said cold mirrors is located on each side of said optical means.

14. The optical system of claim 13; in which said optical means is positioned so that light from a first one of said cold mirrors is incident on an exposure area of said photosensitive substrate before light focused by said optical means is incident on said exposure area.

15. The optical system of claim 14; in which said optical means is positioned so that light from a second one of said cold mirrors is incident on said exposure area after light focused by said optical means is incident on said exposure area.

* * * * *